United States Patent
Zagatsky

(10) Patent No.: US 7,480,404 B2
(45) Date of Patent: Jan. 20, 2009

(54) METHOD AND SYSTEM FOR POSITIONING ARTICLES WITH RESPECT TO A PROCESSING TOOL

(75) Inventor: Yan Zagatsky, Rishon LeZion (IL)

(73) Assignee: Novo Measuring Instruments Ltd., Rehovot (IL)

( * ) Notice: Subject to any disclaimer, the term of this patent is extended or adjusted under 35 U.S.C. 154(b) by 1049 days.

(21) Appl. No.: 10/744,065

(22) Filed: Dec. 24, 2003

(65) Prior Publication Data
US 2005/0063580 A1 Mar. 24, 2005

(30) Foreign Application Priority Data
Sep. 24, 2003 (IL) .................................. 158086

(51) Int. Cl.
G06K 9/00 (2006.01)
G06K 9/32 (2006.01)

(52) U.S. Cl. ....................... 382/151; 382/294

(58) Field of Classification Search ................ 382/151, 382/286, 294, 296
See application file for complete search history.

(56) References Cited

U.S. PATENT DOCUMENTS

| | | | |
|---|---|---|---|
| 5,621,813 A * | 4/1997 | Brown et al. ................ 382/151 |
| 5,682,242 A | 10/1997 | Eylon |
| 5,867,590 A | 2/1999 | Eylon |
| 6,038,029 A | 3/2000 | Finarov |
| 6,225,012 B1 * | 5/2001 | Nishi et al. .................... 430/22 |
| 6,363,168 B1 | 3/2002 | Kakuma |
| 6,368,181 B1 | 4/2002 | Dvir et al. |
| 6,482,713 B2 * | 11/2002 | Marini ........................ 438/401 |
| 6,544,805 B2 | 4/2003 | Holcman et al. |
| 6,950,188 B2 * | 9/2005 | Wu et al. ..................... 356/401 |
| 7,106,897 B1 * | 9/2006 | McIntyre et al. ............. 382/145 |
| 7,295,314 B1 * | 11/2007 | Spady et al. ................. 356/401 |

FOREIGN PATENT DOCUMENTS

| | | |
|---|---|---|
| JP | 59-191679 A | 10/1984 |
| JP | 62-219086 A | 9/1987 |
| JP | 62-279654 A | 12/1987 |

OTHER PUBLICATIONS

Prometrix. "FT-700™ and FT-750™: Film Thickness Probe with StatTrax® version 6.0. User's Guide: vol. 1 of 2" Jul. 1993. 5-11 to 5-20.

* cited by examiner

*Primary Examiner*—Colin LaRose
(74) *Attorney, Agent, or Firm*—Browdy and Neimark, P.L.L.C.

(57) ABSTRACT

A method and system are provided for use in positioning an article, from a group of similar articles, with respect to a processing tool to be applied to the article while the article is located on a stage. A first one of the articles is located on the stage at a predetermined registration of the first article with the stage corresponding to a certain angular orientation of the first article relative to the processing tool. An image of at least a part of the first article is acquired to determine, by image processing, the relative position of at least one site of interest on the first article with respect to the processing tool, thereby enabling to bring said at least one site of interest to the processing position. Data indicative of the relative position of said at least one site of interest of the first article is stored. For another one of said articles to be processed, the predetermined registration of this article with the stage is provide, and the data obtained about the first article is utilized to directly bring the site of interest on said another article to the processing location.

47 Claims, 3 Drawing Sheets

METHOD AND SYSTEM FOR POSITIONING ARTICLES WITH RESPECT TO A PROCESSING TOOL

FIELD OF THE INVENTION

The present invention is generally in the field of alignment techniques and relates to a method and system for positioning articles with respect to a processing tool.

BACKGROUND OF THE INVENTION

Manufacture of articles, such as semiconductor wafers, include various processes requiring precise positioning (alignment) of the article with respect to a processing tool. These processes include measuring, inspecting, monitoring, lithography, etc.

It is known to determine the coarse orientation of a semiconductor wafer by detecting the position of a notch or flat, typically provided on the wafer, while rotating the wafer. Such a method is described for in U.S. Pat. No. 6,038,029 assigned to the assignee of the present application. Another known approach for wafer alignment in semiconductor manufacturing based on detection of the patterned features on a wafer is described in U.S. Pat. Nos. 5,682,242 and 5,867,590 assigned to the assignee of the present application. In this method, the coarse directions of the grid lines on wafer relative to the direction of a reference coordinate system are detected, and then a direction of one of a plurality of directional features on the wafer is determined, thereby providing a location of the grid junction in the reference coordinate system. An alignment technique based on locating the geometrical center of a wafer and of the wafer marker with high accuracy is disclosed in U.S. Pat. No. 6,544,805, assigned to the assignee of the present application.

Various manufacturing or measuring processes are sequentially applied to a plurality of articles progressing on a production line. The articles are thus sequentially mounted on one processing device, and sites of interest (measurement sites) are searched for in each article. However, even in one processing device, it is difficult to determine the positions of the measurement sites, since the respective wafers may have different coordinate values for the measurement sites.

U.S. Pat. No. 6,363,168 describes a method for determining the measurement position on a semiconductor wafer. This method utilizes determination of measurement information regarding a plurality of measurement points on the wafer. The position of each measurement point is expressed by coordinates in a wafer coordinate system defined on the wafer. Then, based on the measurement information, a position of each measurement point on the wafer mounted on the stage is determined. Since the position of each measurement point is expressed by coordinates in the wafer coordinate system, the measurement information including positions can be commonly applied to a plurality of measurement devices.

SUMMARY OF THE INVENTION

There is a need in the art to facilitate processing of articles progressing on a production line by providing a novel method and system enabling to significantly reduce time associated with precise positioning of the article with respect to a processing tool.

The term "processing tool" used herein signifies any one of manufacturing, measuring, and inspection tool.

The main idea of the present invention consists of compensating systematic positioning errors that are inherent for any motion system and can thus occur when processing a plurality of similar articles. This is implemented in the present invention by defining specific step(s) in the article positioning procedure that are very similar for similar (substantially identical) articles to thereby enable to carry out the predefined step(s) on the first article, determine and record data obtained by this step(s) for the first article, and then use said data for positioning each of the other similar articles, while eliminating execution of said step(s) for each other article. The technique of the present invention takes into account misalignment of the article with respect to the processing tool caused by different article's positions relative to the support stage. To this end, the technique of the present invention utilizes a predetermined, common for all the articles, registration of the article on the stage.

It should be noted that the step of determination of the coordinates of at least one site of interest in the first article (registration, measurements, and recordation of the site coordinates) can be carried out during the recipe design step, provided the recipe design is performed on the same processing tool. Hence, in running production wafers' lots, there is no throughput reduction.

There is thus provided according to one broad aspect of the invention, a method of positioning an article, from a group of similar articles, with respect to a processing tool to be applied to the article while located on a stage, the method comprising:
  (a) locating a first one of said articles on the stage at a predetermined registration of the first article with the stage corresponding to a certain angular orientation of the first article relative to the processing tool, acquiring an image of at least a part of the first article to determine, by image processing, the relative position of at least one site of interest on the first article with respect to the processing tool, thereby enabling to bring said at least one site of interest to the processing position;
  (b) storing data indicative of the relative position of said at least one site of interest of the first article;
  (c) for another one of said articles to be processed, providing said predetermined registration with the stage, and utilizing the data obtained about the first article to directly bring the site of interest on said another article to the processing location.

Preferably, the predetermined registration is carried out by utilizing an orientation mark provided on the article. In the case of semiconductor wafers, such an orientation mark is a notch or flat typically provided on wafers.

Preferably, prior to positioning the site of interest at the processing position, a transformation between a coordinate system of the article under processing and a preset coordinate system is determined. If movement of said stage along at least one axis relative to the processing tool is used to bring the site of interest to the processing location, the preset coordinate system is the coordinate system of the stage. If movement of at least a part of the processing tool with respect to the stage is used, the preset coordinate system is the coordinate system of the processing tool. If movement of both the stage and at least part of the processing tool with respect to one another is used, the preset coordinate system is a preset relative coordinate system between the coordinate systems of the stage and of the processing tool.

The measured data about the first article thus includes data indicative of the transformation for the first article. While positioning the other article, correlation between the transformations determined for the first article and said other article is determined.

Preferably, the determination of the transformation is carried out by utilizing one or more alignment features provided on the article. The alignment feature preferably has asymmetric geometry. The determination of the transformation may for example consist of determining the coordinates of the center of the article using the alignment feature provided on the article. Alternatively or additionally, the determination of the transformation comprises determining an angle between a characteristic axis of the article (for wafers—that of the scribe lines) and the preset coordinate system. To this end, at least one alignment feature on the article can be used.

Preferably, the determination of the relative position of the site of interest for the first article comprises: providing said predetermined registration; detecting an alignment feature on the first article associated with the first site of interest, and determining the coordinates of said alignment feature; using said coordinates of the alignment feature to bring said first site of interest to the processing location, and storing data indicative of the coordinates of said first site of interest in said preset coordinate system. The alignment feature preferably has an asymmetric geometry. The determined coordinates of the alignment feature are used to determine a transformation between the coordinate system of the first article and the preset coordinate system with certain accuracy. The detection of the alignment feature is carrying out by an image processing based on pattern recognition.

Preferably, in order to increase the accuracy, the coordinates of more than one alignment feature associated with different sites of interest in the same article are determined. These different sites of interest are selected to be maximally distanced from each other as compared to all other sites of interest in the article. Preferably, the different sites of interest are closest to the periphery region of the article.

The method can utilize verification of the site of interest that has been brought to the processing position by carrying out an image processing based on pattern recognition. Such a verification procedure is preferably carried out with respect to selective sites of interest, and may be used for correcting (for about a few pixels' size) the positioning of further sites of interest.

Preferably, prior to performing the predetermined registration, a certain reference position of the stage with respect to the processing tool is provided.

According to another broad aspect of the present invention, there is provided a system for use in sequential processing of a group of similar articles, the system comprising:
 (a) a rotatable stage for holding the article during the processing;
 (b) an optical system operable to detect an orientation mark provided on the article thereby enabling to locate the article on the stage at a predetermined registration of the article with the stage, and operable to locate a site of interest on the article thereby enabling to bring this site of interest to the processing position;
 (c) a control unit having a processor utility preprogrammed to determine data indicative of the relative position of the site of interest positioned at the processing location and storing said data in a memory utility, to thereby enable to utilize said data obtained with respect to the first article for each of the other articles, and thereby enabling directly bring a site of interest on the other article to the processing location upon providing said predetermined registration of said other article utilizing an orientation mark on said other article.

Preferably, the optical system comprises a first optical assembly configured for finding the orientation mark on the article, and a second optical assembly configured for locating the site of interest on the article. Alternatively, the same imaging system can be used for both of these functions. The optical system can be configured such that the first optical assembly operates to locate the orientation mark with first accuracy, and the second optical assembly operates to determine the location of the orientation mark with second higher accuracy.

Preferably, the optical system comprises a spectrometer arrangement (e.g., spectrophotometer or spectral ellipsometer).

The processor utility is preprogrammed to detect the existence of a predetermined angular orientation of the orientation mark on the article in a preset coordinate system, and to generate a control signal to provide the predetermined registration of the article.

The stage is preferably an R-Theta stage. Alternatively, the stage is rotatable, and a relative displacement between the stage and processing tool according to at least one horizontal axis is provided by moving at least part of the processing tool.

The system of the present invention can be used as a stand-alone unit to receive and measure wafers from the processing machine, or can be used in integrated metrology. In the latter case, the optical system may be configured to have an imaging channel (positioning channel) and a measuring channel (processing tool).

More specifically, the present invention is used for processing semiconductor wafers and is therefore described below with reference to this application.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
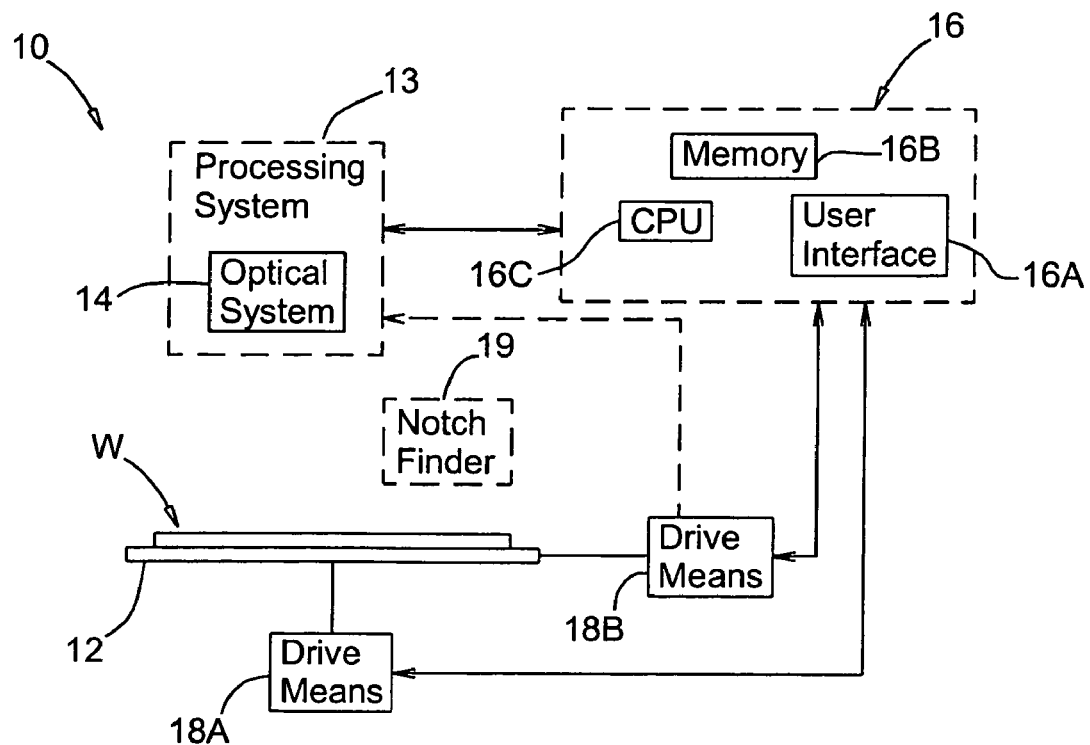
FIG. 1 is a block diagram of a system according to the invention.

Referring to FIG. 1, there is illustrated a system 10 constructed and operated according to the invention for controlling sequential measuring (generally, processing) of a group of similar articles (semiconductor wafers). The system 10 comprises a stage 12 for holding a wafer W during the processing; a measuring (processing) system 13 including an optical system 14; and a control unit 16. The stage 12 is driven by a drive means 18A for rotation in a horizontal plane (Theta-stage) and is preferably also driven by a drive means 18B for a reciprocating movement in the horizontal plane along at least one axis (R-stage). It should be noted that alternatively an X-Y-stage can be used. It should also be noted that, generally, alternative or additional to the stage movement along at least one axis, a movement of the measuring system (or at least a part thereof) with respect to the stage may be used. Accordingly, as shown in the figure in dashed lines, the drive means 18B may be associated with the stage and/or the measuring system.

Figure 2A:
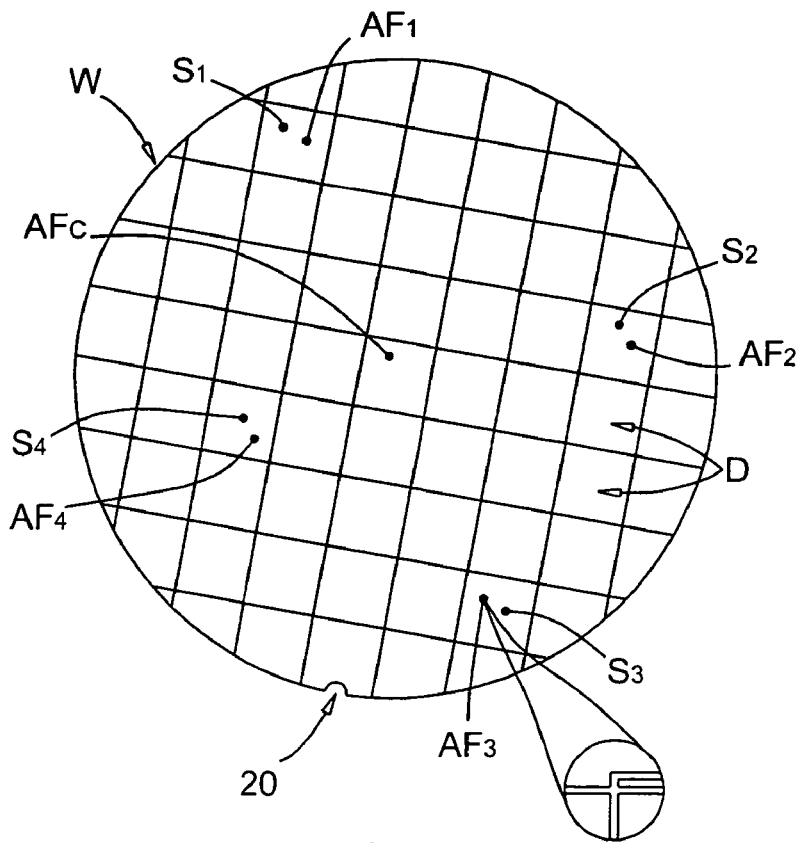
FIG. 2A schematically illustrates a semiconductor wafer typically formed with an orientation mark (notch) and alignment features.

As shown in FIG. 2A, a semiconductor wafer W is typically provided with a notch or flat 20 (constituting an orientation mark). One or more selected sites of interest $S_1$-$S_4$ on the wafer are to be processed (measured). These sites are associated with their-related alignment features $AF_1$-$AF_4$, which may be "specific targets" or actual pattern elements. Typically, the relative location between the alignment feature and its associated site of interest is known. These alignment features can thus be used to bring the site of interest to the processing location. Typically, a certain alignment feature $AF_c$ is selected as being associated with the center of the wafer. It should be noted that more than one sites of interest can be associated with a common alignment feature (e.g., within the die). As shown in the figure, the alignment feature preferably has asymmetric geometry. This facilitates detection of the alignment feature using pattern recognition based image processing.

Turning back to FIG. 1, in order to bring the site of interest to the processing location, the stage 12 and/or at least part of the processing system 13 is movable relative to one another. The positioning of the site of interest is implemented using a preset coordinate system, which may be that of the stage if only stage is movable, that of the measuring system if movement of at least a part thereof is considered, or may be a certain relative coordinate system between the coordinate systems of the stage and of the measuring system.

The system 10 is configured and operable to detect the orientation mark (e.g., notch) provided on the wafer thereby enabling to locate the wafer on the stage at a predetermined registration of the wafer with the stage. This can be implemented either by using the image processing of optical system 13, or by using a separate notch finding assembly 19 (shown in the figure dashed lines as its provision is optional). An example of such a notch finder assembly is disclosed in U.S. Pat. No. 6,038,029, assigned to the assignee of the present application. The separate notch finder assembly, such as for example an opto-couple detector, may be associated with the stage.

The optical system 14 is configured and operable to locate a site of interest on the wafer thereby enabling to bring this site of interest to the measuring (processing) position. An example of the configuration of system 10 will be described below with reference to FIG. 4.

The control unit 16 is typically a computer system having such main functional element as user interface 16A, a memory utility 16B, and a processor utility 16C. The latter is preprogrammed to analyze measured data coming from the optical system and data indicative of the stage position relative to the optical system to determine data indicative of the relative position of the site of interest currently at the processing location and to store this data in the memory utility.

Figure 3:
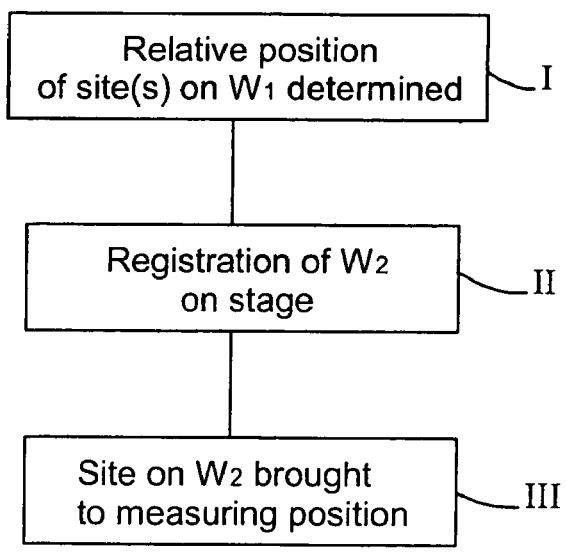
FIG. 3 is a flow chart of the main steps in the method according to the invention.

The main steps in the operation of the system 10 will now be described with reference to FIG. 3:

Phase I—A first wafer $W_1$ from the group of similar wafers (e.g., lot) is located on the stage 12 and the relative position of at least one site of interest $S_1$ on this wafer relative to the processing system 13 is determined to enable the use of the relative coordinates of the site to directly bring a similar site of each other wafers to the processing position. This technique solves the problem associated with the fact that the stage positioning typically has random or non-systematic errors (that cannot be corrected for) and systematic errors (that can be corrected for). The method of the present invention provides for measuring at the first step the "vector" of a systematic error for each alignment feature. This is implemented by carrying out the so-called "coarse alignment" of the wafer $W_1$ on stage relative to the processing system, and preferably also and "fine alignment" to enable determination of the transformation between the coordinate system of the wafer and a preset coordinate system, and then locating the site of interest and determining its relative coordinates. More specifically:

For the purposes of coarse alignment, the optical system 14 (FIG. 1) or separate assembly (e.g., notch finder 19 in FIG. 1) is operated to detect the orientation mark on the wafer $W_1$, and the stage 12 is operated (rotated) accordingly to provide a predetermined registration of the wafer $W_1$, e.g., a predetermined angular orientation of the orientation mark, e.g., notch (20 in FIG. 2A), in a preset coordinate system with a certain degree of accuracy. The stage is preferably also provided with a certain reference mark and is initially oriented to provide a certain position of this reference mark with respect to a wafer on loader (the so-called "pre-alignment procedure").

In order to provide the fine alignment, a correlation between the preset coordinate system and the coordinate system of the stage is determined. This can be implemented utilizing the technique disclosed in U.S. Pat. Nos. 5,682,242 and 5,867,590, both assigned to the assignee of the present application.

Figure 2B:
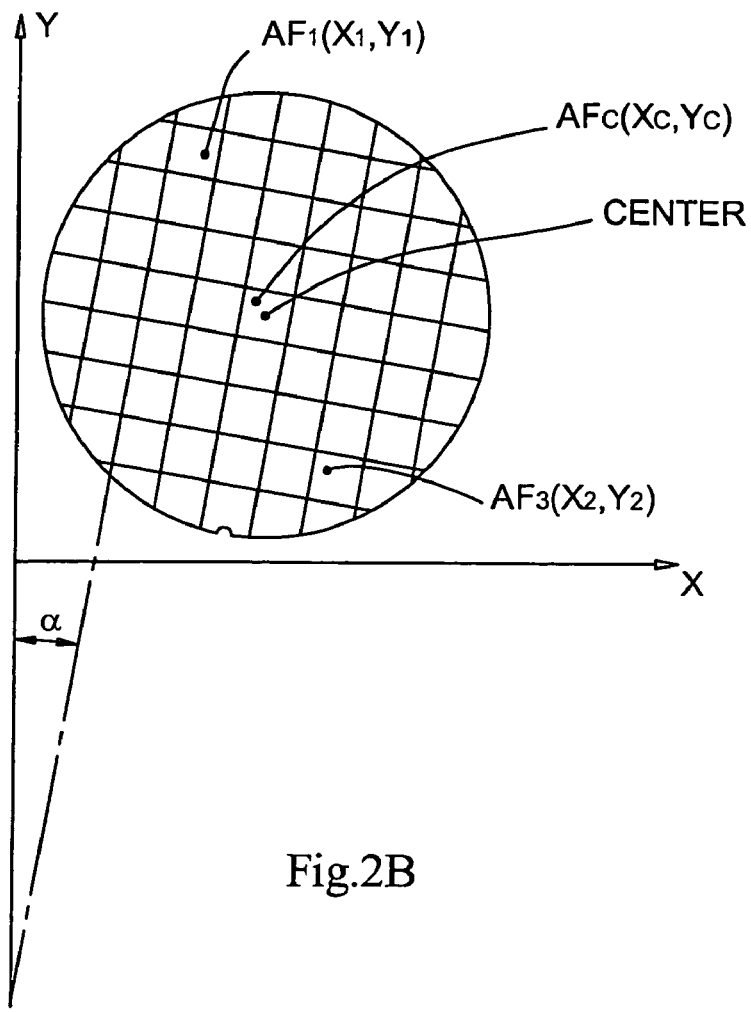
FIG. 2B exemplifies a technique suitable to be used for the fine alignment procedure.

FIG. 2B exemplifies a method suitable to be used in the fine alignment procedure. As shown, wafer W is in the predetermined registration with the stage. The alignment feature $AF_c$ associated with the wafer's center is located and its coordinates, $X_c$ and $Y_c$, in the preset coordinate system are used to determine the coordinates of the wafer's center. It should be understood that the wafer's center can be located in any other suitable way. Additionally, at least one, but preferably two other alignment features $AF_1$ and $AF_3$, are detected (preferably, those maximally distanced from each other, e.g., located closer to the edge region of the wafer). The coordinates of the so-detected two maximally spaced alignment features provide for determining an angular orientation of the wafer within the preset coordinate system (keeping in mind that the relative position of the alignment features in the wafer are known), i.e., angle $\alpha$ between a characteristic axis of the article (a scribe lines' axis for wafer) and the preset coordinate system. Having determined the coordinates of the wafer's center and the angle $\alpha$, transformation (X, Y, $\alpha$) between the wafer's coordinate system and said preset coordinate system can be defined. It should be understood that, generally, any other suitable technique can be used for the same purpose. For example, in the case of sufficiently large field of view of the optical system (14 in FIG. 1), imaging of the scribe lines can be used for directly determining the angle $\alpha$. It should also be understood that this technique is similarly useful for both the (X, Y) and (R, Theta) coordinate systems.

To locate the site of interest ("site alignment" step), the optical system 14 is operated utilizing the respective alignment feature and the known data regarding the relative location between the alignment feature and this site. The stage and/or optical system (at least part thereof) is moved to bring this site to the measuring position. Then, the control unit (its processor utility) operates to determine the coordinates of this site of interest in the preset coordinate system (as defined above) and store data indicative thereof for the first wafer $W_1$ in the memory utility.

It should be noted that the alignment feature location may present a measurement site itself, or alignment feature may be located proximate to the measurement site, so that the additional displacement error be minimal.

In some cases, fine alignment procedure may be combined with site alignment step and/or it may be elaborated by the determination of the coordinates of at least one alignment feature associated with different sites of interest. These different sites of interest are preferable selected as being maximally distanced from each other as compared to all other sites of interest in the wafer, e.g., are the closest ones to the periphery region of the wafer.

As indicated above, phase I of determination of the coordinates of at least one site of interest in the first article (registration, measurements, and recordation of the site coordinates) can be carried out during the recipe design step, provided the recipe design is performed on the same processing tool.

Phase II—when a further, second wafer $W_2$ is to be measured, it is located on the stage with the predetermined registration maximally corresponding to that of the wafer $W_1$ on stage. This is implemented in the above-described manner, namely, the coarse alignment using the orientation mark on wafer $W_2$, and the fine alignment procedure. The transformation determined during the fine alignment procedure for $W_2$—(X',Y', α')—are used to determine respective tolerances as compared to the transformation for $W_1$. These tolerances can then be used for direct positioning the similar site of interest in $W_2$ to the processing position (with no site alignment procedure for $W_2$). It should be understood that the higher the precision of the coarse alignment procedure, the smaller are the tolerances at the fine alignment.

Phase III—The control unit 16 operates the movement of the stage and/or at least part of the optical system to directly bring the similar site of interest on wafer $W_2$ (similar to that of the first wafer $W_1$) to the measuring position. This is implemented utilizing the previously stored data regarding the coordinates of this site on the first wafer $W_1$ and the results of the fine alignment procedure for wafer $W_2$.

Now, the measuring (processing) system may operate to carry out measurements in wafer $W_2$.

It should be understood that the technique of the present invention, due to the fact it utilizes the preset accurate registration between the wafer and stage for each wafer in the group of similar wafers, provides for eliminating the time consuming site alignment procedure for each "second" wafer (i.e., eliminates the determination of the coordinates of the site in the specific coordinate system). It should, however, be noted that the alignment procedure can be selectively repeated for some wafers, for example, when environment conditions of the processing have been changed.

In the case the wafer processing includes optical measurements, the processing system 13 may utilize common optics for both optical positioning channel (optical system 14 in FIG. 1) and an optical measuring channel. As for the notch finder, the same optical system 13 or a separate optical arrangement can be used.

Figure 4:
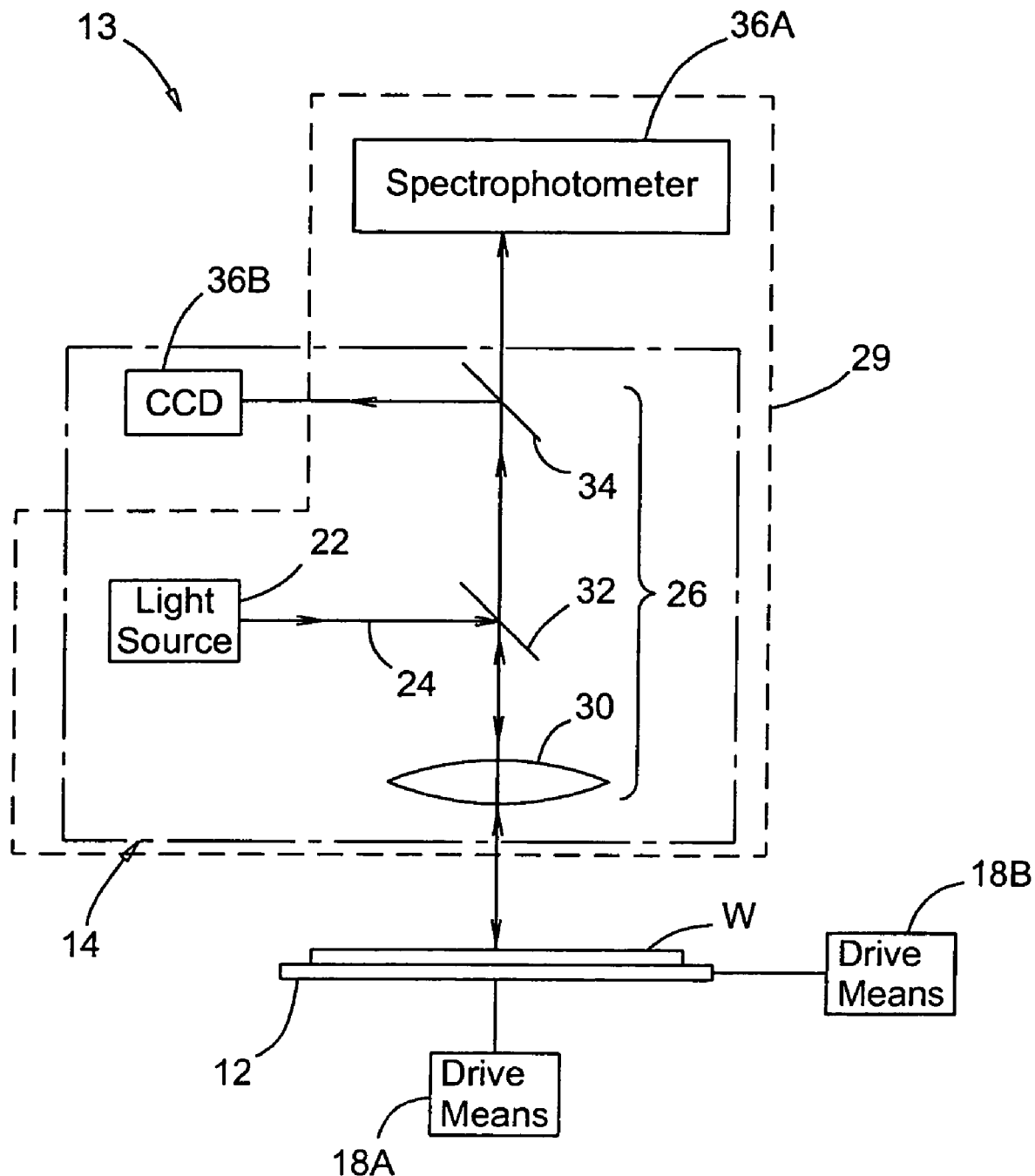
FIG. 4 exemplifies an optical system suitable to be used in the positioning system of the present invention.

Reference is made to FIG. 4 exemplifying the configuration of the measuring system 13. Generally, the system may be of any known type, for example that described in U.S. Pat. No. 6,368,181, assigned to the assignee of the present application. In this specific but not limiting example, the wafer processing includes optical measurements, and also the system 13 is configured for carrying out spectrometric measurements, e.g., spectrophotometric or spectral ellipsometry measurements. The system thus comprises a light source 22 for generating a beam of light 24 of a predetermined wavelength range, light directing optics 26, and a detector unit including spectrophotometric and imaging detectors 36A and 36B typically equipped with imaging optics (not shown). The light directing optics 26 is configured to define the optical positioning channel 14 and an optical measuring channel 29, and includes an objective lens arrangement 30 and beam splitters 32 and 34.

The light beam 24 is reflected by the beam splitter 32 and then focused by the objective 30 onto the wafer W. Light returned (reflected) from the illuminated location on the wafer is collected by the objective 30, passes through the beam splitter 32, and then split by the beam splitter 34 into first and second portions propagating towards, respectively, the spectrophotometric detector 36A and imaging detector (CCD camera) 36B.

The spectrophotometric channel exemplifies a measuring channel, which may be replaced by any other processing arrangement depending on the requirements of a specific application. For example, such a processing tool may be electrical measuring tool or a manufacturing tool, such as a lithography tool, requiring a certain positioning of an article under processing relative to the processing tool.

As indicated above, the notch finding may be implemented by the same optical system 14 or by a separate optical arrangement. Considering the use of the system 14 for notch finding, this can for example be implemented by positioning the system 14 with respect to wafer on stage such that the system "views" the edge region of the wafer, and rotating the stage upon bringing the notch into the field of view of the imaging detector.

Preferably, a separate notch finding sensor is used, which may be of any known kind, e.g., that including an optoelectron pair. In this case, the optical system preferably also operates to image the notch-containing site previously found by the notch sensor (pre-alignment) and determine the location of the notch with higher accuracy as compared to that of the notch finder.

Additionally, upon bringing the site of interest into a processing (measuring) position based on the site coordinates previously detected for the "first" wafer, the optical system 14 may operate to verify the site by carrying out pattern recognition and, if needed, perform a positioning correction within a range of a few pixels' size.

Those skilled in the art will readily appreciate that various modifications and changes may be applied to the embodiment of the invention as hereinbefore exemplified without departing from its scope defined in and by the appended claims. For example, the stage may be movable along X-axis or along X- and Y-axes. Additionally to the axis movement of the stage and instead of this movement, at least a part of the measuring system may be movable relative to the stage. The optical system may be configured for both detection of the orientation mark (registration of the article on stage) and detection of the site of interest (alignment feature) on the article, or may include separate optical assemblies for performing these functions.

The invention claimed is:

1. A method of positioning an article, from a group of similar articles, with respect to a processing tool to be applied to the article while located on a stage, the method comprising:

(a) locating a first one of said articles on the stage at a predetermined registration of the first article with the stage corresponding to a certain angular orientation of the first article relative to the processing tool; determining a transformation between a coordinate system of the article under processing and a coordinate system of the processing tool; acquiring an image of at least a part of the first article to determine, by image processing, the relative position of at least one site of interest on the first article with respect to the processing tool, thereby enabling to bring said at least one site of interest to the processing position by moving at least a part of said processing tool with respect to the stage;

(b) storing data indicative of the relative position of said at least one site of interest of the first article;

(c) for another one of said articles to be processed, providing said predetermined registration with the stage, and utilizing the data obtained about the first article to directly bring the site of interest on said another article to the processing location.

2. The method of claim 1, wherein said determining of the relative position of the site of interest utilizes an orientation mark provided on the article.

3. The method of claim 2, wherein the orientation mark is a notch or flat provided on the wafer.

4. The method of claim 1, wherein said predetermined registration is carried out utilizing an orientation mark provided on the article.

5. The method of claim 1, wherein said stage is movable with respect to the processing tool to bring the site of interest to the processing location, said preset coordinate system being the coordinate system of the stage.

6. The method of claim 1, wherein the stage and at least a part of the processing tool are movable to bring the site of interest to the processing location, said preset coordinate system being a preset relative coordinate system between the coordinate systems of the stage and of the processing tool.

7. The method of claim 1, wherein the measured data about the first article comprises data indicative of the transformation for the first article.

8. The method of claim 7, comprising: while positioning said another article, determining correlation between the transformations determined for the first article and said another article.

9. The method of claim 1, wherein the determination of the transformation is carried out utilizing one or more alignment features provided on the article.

10. The method of claim 9, wherein the alignment feature has asymmetric geometry.

11. The method of claim 9, wherein the alignment feature is detected by carrying out an image processing based on pattern recognition.

12. The method of claim 1, wherein the determination of the transformation comprises determining the coordinates of the center of the article using the alignment feature provided on the article.

13. The method of claim 1, wherein the determination of the transformation comprises determining an angle between a characteristic axis of the article and the preset coordinate system.

14. The method of claim 13, wherein the determination of said angle is carried out using at least one alignment feature provided on the article.

15. The method of claim 1, wherein said determining of the relative position of the site of interest for the first article comprises:

providing said predetermined registration;

detecting an alignment feature on the first article associated with the first site of interest, and determining the coordinates of said alignment feature;

using said coordinates of the alignment feature to bring said first site of interest to the processing location, and storing data indicative of the coordinates of said first site of interest in said preset coordinate system.

16. The method of claim 15, comprising utilizing the determined coordinates of the alignment feature to determine a transformation between the coordinate system of said first article and said preset coordinate system with certain accuracy.

17. The method of claim 16, comprising increasing said accuracy by determining the coordinates of more than one alignment feature associated with different sites of interest in the same article.

18. The method of claim 17, wherein said different sites of interest are maximally distanced from each other as compared to all other sites of interest in the article.

19. The method of claim 17, wherein said different sites of interest are closest to the periphery region of the article as compared to all other sites of interest in the article.

20. The method of claim 1, comprising verifying the site of interest that has been brought to the processing position by carrying out an image processing based on pattern recognition, and generating verification data indicative thereof.

21. The method of claim 20, wherein said verifying is carried out with respect to selective sites of interest.

22. The method of claim 21, wherein said verification data is used for correcting the positioning of further sites of interest.

23. The method of claim 22, wherein the correcting is of about a few pixels' size.

24. The method of claim 1, wherein said stage is one of the following: an R-Theta stage, and a rotatable X-Y stage.

25. The method of claim 24, comprising initially providing a certain reference position of the stage with respect to the processing tool, prior to performing said predetermined registration.

26. The method of claim 1, wherein said processing includes at least one of the following: manufacturing, measuring, and inspecting the article.

27. The method of claim 26, wherein said measuring includes thickness measuring.

28. The method of claim 27, wherein said measuring includes spectrometry based measurements.

29. The method of claim 26, wherein said measuring includes spectrometry based measurements.

30. The method of claim 26, wherein said measuring includes spectrophotometry based measurements.

31. The method of claim 26, wherein said measuring includes spectral ellipsometry based measurements.

32. The method of claim 1, wherein said article is a semiconductor wafer.

33. The method of claim 1, wherein said processing is integrated metrology.

34. The method of claim 33, wherein said positioning is carried out by an optical system located adjacent to the processing tool.

35. The method of claim 1, wherein said processing includes optical measurements in the article, said positioning being carried out by an optical system of the processing tool.

36. The method of claim 1, wherein said positioning is carried out by a stand-alone system.

37. A system for use in sequential processing of a group of similar articles, the system comprising:

(a) a rotatable stage for holding the article during the processing;

(b) an optical system operable to detect an orientation mark provided on the article thereby enabling to locate the article on the stage at a predetermined registration of the article with the stage, and operable to locate a site of interest on the article thereby enabling to bring this site of interest to the processing position;

(c) a control unit having a processor utility preprogrammed to determine data indicative of the relative position of the site of interest positioned at the processing location and storing said data in a memory utility, to thereby enable to utilize said data obtained with respect to the first article for each of the other articles, and thereby enabling to directly bring a site of interest on the other article to the processing location upon providing said predetermined registration of said other article utilizing an orientation mark on said other article, at least a part of said processing tool being movable with respect to the stage to bring the site of interest to the processing location and said processor utility operating to detect the existence of a predetermined angular orientation of the article in a coordinate system of the processing tool, to generate a control signal to provide the predetermined registration.

38. The system of claim 37, wherein said optical system comprises a first optical assembly configured for finding the orientation mark on the article, and a second optical assembly configured for locating the site of interest on the article.

39. The system of claim 38, wherein said first optical assembly is operable for locating the orientation mark with first accuracy, and said second optical assembly is operable to determine the location of the orientation mark with second higher accuracy.

40. The system of claim 37, wherein the optical system comprises a spectrometer arrangement.

41. The system of claim 40, wherein the optical system comprises a spectrophotometer arrangement.

42. The system of claim 40, wherein said optical system comprises a spectral ellipsometer.

43. A method of positioning an article, from a group of similar articles, with respect to a processing tool to be applied to the article while located on a stage, the method comprising:
(a) locating a first one of said articles on the stage at a predetermined registration of the first article with the stage corresponding to a certain angular orientation of the first article relative to the processing tool; determining a transformation between a coordinate system of the article under processing and a present coordinate system being a preset relative coordinate system between the coordinate systems of the stage and of the processing tool; acquiring an image of at least a part of the first article to determine, by image processing, the relative position of at least one site of interest on the first article with respect to the processing tool, thereby enabling to bring said at least one site of interest to the processing position by moving the stage and at least a part of the processing tool with respect to one another;
(b) storing data indicative of the relative position of said at least one site of interest of the first article;
(c) for another one of said articles to be processed, providing said predetermined registration with the stage, and utilizing the data obtained about the first article to directly bring the site of interest on said another article to the processing location.

44. A method of positioning an article, from a group of similar articles, with respect to a processing tool to be applied to the article while located on a stage, the method comprising:
(a) locating a first one of said articles on the stage at a predetermined registration of the first article with the stage corresponding to a certain angular orientation of the first article relative to the processing tool; determining a transformation between a coordinate system of the article under processing and a present coordinate system; acquiring an image of at least a part of the first article to determine, by image processing, the relative position of at least one site of interest on the first article with respect to the processing tool, thereby enabling to bring said at least one site of interest to the processing position;
(b) storing data indicative of the relative position of said at least one site of interest of the first article, said data comprises data indicative of the transformation for the first article;
(c) for another one of said articles to be processed, providing said predetermined registration with the stage, and utilizing the data obtained about the first article to directly bring the site of interest on said another article to the processing location; and while positioning said another article, determining correlation between the transformations determined for the first article and said another article.

45. A method of positioning an article, from a group of similar articles, with respect to a processing tool to be applied to the article while located on a stage, the method comprising:
(a) locating a first one of said articles on the stage at a predetermined registration of the first article with the stage corresponding to a certain angular orientation of the first article relative to the processing tool; acquiring an image of at least a part of the first article to determine, by image processing the relative position of at least one site of interest on the first article with respect to the processing tool, thereby enabling to bring said at least one site of interest to the processing position, said determining of the relative position of the site of interest for the first article comprising detecting an alignment feature on the first article associated with the first site of interest and determining the coordinates of said alignment feature, using said coordinates of the alignment feature to bring said first site of interest to the processing location and to determine a transformation between the coordinate system of said first article and said preset coordinate system with certain accuracy, said accuracy being increased by determining the coordinates of more than one alignment feature associated with different sites of interest in the same article which are maximally distanced from each other as compared to all other sites of interest in the article;
(b) storing data indicative of the relative position of said at least one site of interest of the first article, said data comprising data indicative of the coordinates of said first site of interest in said preset coordinate system;
(c) for another one of said articles to be processed, providing said predetermined registration with the stage, and utilizing the data obtained about the first article to directly bring the site of interest on said another article to the processing location.

46. A method of positioning an article, from a group of similar articles, with respect to a processing tool to be applied to the article while located on a stage, the method comprising:
(a) locating a first one of said articles on the stage at a predetermined registration of the first article with the stage corresponding to a certain angular orientation of the first article relative to the processing tool; acquiring an image of at least a part of the first article to determine, by image processing, the relative position of at least one site of interest on the first article with respect to the processing tool, thereby enabling to bring said at least one site of interest to the processing position, said determining of the relative position of the site of interest for the first article comprising detecting an alignment feature on the first article associated with the first site of interest and determining the coordinates of said alignment feature, using said coordinates of the alignment feature to bring said first site of interest to the processing location and to determine a transformation between the coordinate system of said first article and said preset coordinate system with certain accuracy, said accuracy being increased by determining the coordinates of more than one alignment feature associated with different sites of interest in the same article which are closest to the periphery region of the article as compared to all other sites of interest in the article;

(b) storing data indicative of the relative position of said at least one site of interest of the first article, said data comprising data indicative of the coordinates of said first site of interest in said preset coordinate system;

(c) for another one of said articles to be processed, providing said predetermined registration with the stage, and utilizing the data obtained about the first article to directly bring the site of interest on said another article to the processing location.

47. A system for use in sequential processing of a group of similar articles by a processing tool, the system comprising:

(a) a rotatable stage for holding the article during the processing;

(b) an optical system operable to detect an orientation mark provided on the article thereby enabling to locate the article on the stage at a predetermined registration of the article with the stage, and operable to locate a site of interest on the article thereby enabling to bring this site of interest to the processing position;

(c) a control unit having a processor utility preprogrammed to determine data indicative of the relative position of the site of interest positioned at the processing location and storing said data in a memory utility, to thereby enable to utilize said data obtained with respect to the first article for each of the other articles, and thereby enabling to directly bring a site of interest on the other article to the processing location upon providing said predetermined registration of said other article utilizing an orientation mark on said other article, said processor utility operating to detect the existence of a predetermined angular orientation of the article in a preset relative coordinate system between the coordinate systems of the stage and of the processing tool, to generate a control signal to provide the predetermined registration, the stage and at least a part of the processing tool being movable to bring the site of interest to the processing location.

* * * * *